US009250270B2

(12) United States Patent
Mosser et al.

(10) Patent No.: US 9,250,270 B2
(45) Date of Patent: Feb. 2, 2016

(54) ELECTRICITY METER HAVING MULTIPLE HALL DEVICES

(71) Applicant: Itron, Inc., Liberty Lake, WA (US)

(72) Inventors: Vincent Mosser, Le Plessis-Robinson (FR); Youcef Haddab, Paris (FR); David Nelson Makinson, Seneca, SC (US); Steven Grey, Seneca, SC (US)

(73) Assignee: Itron, Inc., Liberty Lake, WA (US)

( * ) Notice: Subject to any disclaimer, the term of this patent is extended or adjusted under 35 U.S.C. 154(b) by 182 days.

(21) Appl. No.: 13/840,749

(22) Filed: Mar. 15, 2013

(65) Prior Publication Data

US 2014/0266171 A1    Sep. 18, 2014

(51) Int. Cl.
*G01R 33/00* (2006.01)
*G01R 15/20* (2006.01)
*G01R 22/06* (2006.01)

(52) U.S. Cl.
CPC ............ *G01R 15/202* (2013.01); *G01R 15/207* (2013.01); *G01R 22/061* (2013.01)

(58) Field of Classification Search
CPC ........ G01R 33/00; G01R 33/02; G01R 33/04; G01R 33/06; G01R 33/0005; G01R 33/0052; G01R 33/072; G01R 33/0047; G01R 15/14; G01R 15/20; G01R 15/202; G01R 15/207; G01R 22/061
USPC .............. 324/252, 207.2, 244, 249, 251, 253, 324/117 H, 117 R, 207.21, 228
See application file for complete search history.

(56) References Cited

U.S. PATENT DOCUMENTS

| 5,041,780 A | * | 8/1991 | Rippel .................... 324/117 H |
| 2005/0030004 A1 | * | 2/2005 | Takatsuka et al. ........ 324/117 H |
| 2009/0058412 A1 | * | 3/2009 | Taylor et al. .................. 324/252 |
| 2010/0045286 A1 | | 2/2010 | Hotz et al. |
| 2011/0234215 A1 | | 9/2011 | Ausserlechner |

FOREIGN PATENT DOCUMENTS

| DE | 102008002305 | | 12/2009 |
| EP | 1467214 | | 10/2004 |
| EP | 1855118 | | 11/2007 |
| JP | 2001066327 | | 3/2001 |
| JP | 2010266290 A | * | 11/2010 |

(Continued)

OTHER PUBLICATIONS

PCT Search Report and Written Opinion mailed Jul. 7, 2014 for PCT Application No. PCT/US14/22115, 11 Pages.
Chen et al., "Design of a Novel Power Current Micro-Sensor for Traction Power Supply Using Two Hall ICs", IEEE Vehicular Technology Conference Fall (VTC 2009—Fall), Sep. 2009, 5 pages.

(Continued)

*Primary Examiner* — Son Le
(74) *Attorney, Agent, or Firm* — Lee & Hayes, PLLC

(57) ABSTRACT

Disclosed is a metrology assembly that utilizes a multi-Hall effect device configuration which eliminates the necessity of a magnetic concentrator. In some embodiments, the metrology assembly includes a substrate or support platform configured to support at least two Hall effect devices per phase of an electricity meter. The metrology assembly may further include one or more electrical conductors coupled to the substrate and configured to conduct electric current. The at least two Hall effect devices may be coupled to the substrate at opposing sides of an associated electrical conductor, each Hall effect device being configured to detect a magnetic field created by the electric current of the associated electrical conductor, and to generate an output.

19 Claims, 8 Drawing Sheets

(56) References Cited

FOREIGN PATENT DOCUMENTS

| | | | |
|---|---|---|---|
| JP | 2011080973 | | 4/2011 |
| JP | 2011080973 A | * | 4/2011 |
| JP | 4839393 | | 12/2011 |
| WO | WO0033090 | | 6/2000 |
| WO | WO2012050048 | | 4/2012 |

OTHER PUBLICATIONS

Chen, et al., "A New Method for Power Current Measurement Using a Coreless Hall Effect Current Transformer", IEEE Transactions on Instrumentation and Measurement, vol. 60, No. 1, Jan. 2011, pp. 158-169.

* cited by examiner (Section A-A)

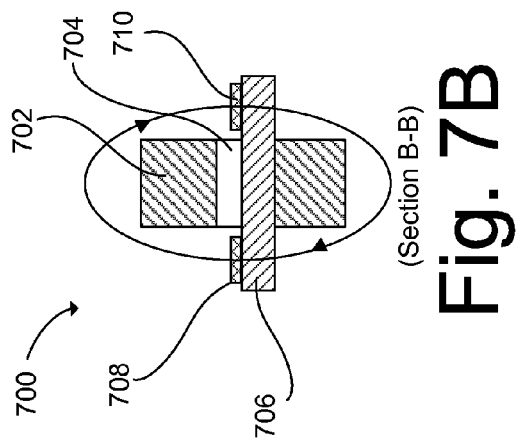
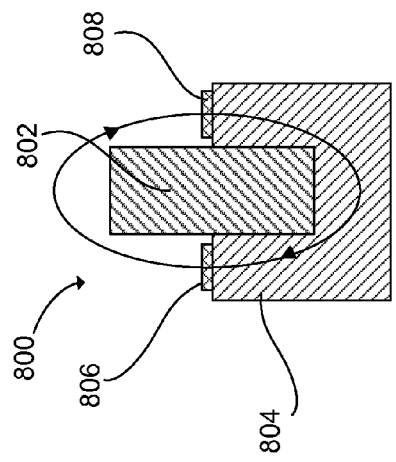
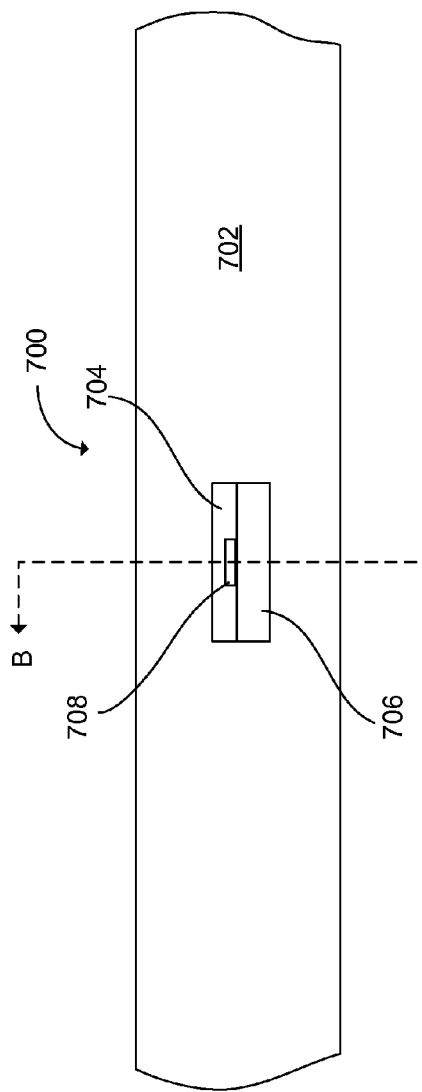
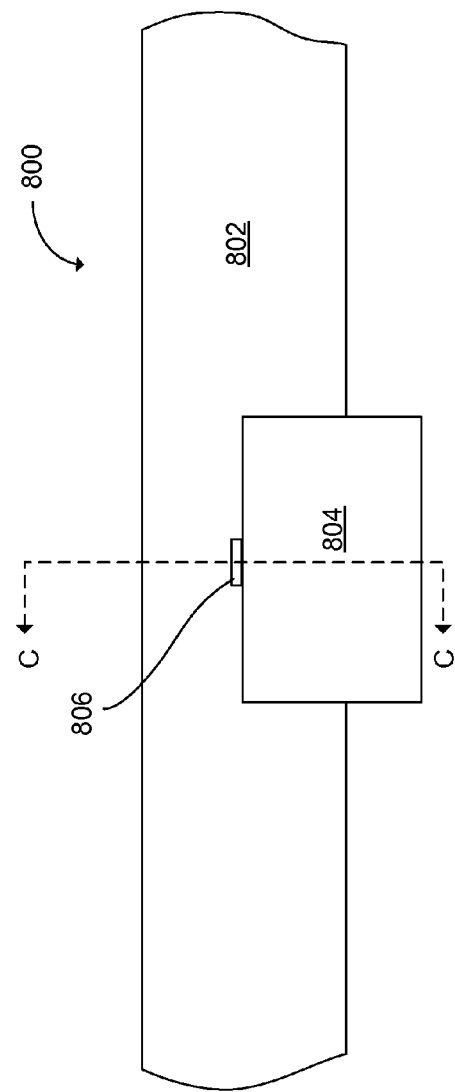

ELECTRICITY METER HAVING MULTIPLE HALL DEVICES

BACKGROUND

Electricity meters provide a mechanism for utility companies to measure electricity consumption at a residence, business, facility, or other site. Such electricity meters contain metrology to sense and measure electricity consumption at the site. The metrology typically includes one or more hardware components, including sensors, which makes up a metrology device. Various technologies and associated hardware can be used for a metrology device of an electricity meter including shunts, current transformers, Rogowski coils, Hall effect devices, etc.

Particularly, metrology devices that use Hall effect devices ("Hall-based" metrology devices) leverage the Hall effect to allow the metrology device to detect an electric current flowing through one or more electrical conductors. That is, an electrical conductor with a current flowing through it produces a magnetic field that is proportional to the current flowing through the electrical conductor. This magnetic field is detectable by the Hall effect device which generates an output corresponding to the magnetic flux density of the magnetic field.

Electricity meters may be single-phase, bi-phase or polyphase meters. Hall-based metrology devices typically use a combination of a single Hall effect sensor and a magnetic concentrator, such as a magnetically permeable core (e.g., iron core), for each phase of the electricity meter. The purpose of the magnetic concentrator is to strengthen or concentrate the magnetic field produced by an electrical conductor carrying an electric current, as well as to shield the Hall effect device from external alternating current (AC) fields.

One known drawback of traditional Hall-based metrology devices is that they are susceptible to tampering with a direct current (DC) magnet (sometimes referred to as a DC magnet attack). Specifically, a DC magnet positioned next to the magnetic concentrator can saturate the magnetic concentrator (typically an iron core) so that it degrades the magnetic properties of the material used in the magnetic concentrator. DC magnet attacks results in reduction in measurement accuracy and can potentially cause under-billing based on the electricity meter's measurement of electricity consumption. These types of DC magnet attacks are becoming a serious concern in the utility industry due to the potential for under-billing resulting from tampering with the metrology devices in electricity meters.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

FIG. 7A illustrates a side view of an example metrology assembly according to another embodiment, the metrology assembly including a substrate configured to be received within a slot of an electrical conductor.

FIG. 7B illustrates a front, cross-sectional view of the metrology assembly of FIG. 7A along section line B-B.

FIG. 8A illustrates a side view of an example metrology assembly according to another embodiment, the metrology assembly including a substrate configured to couple to an electrical conductor by surrounding an underside of the electrical conductor.

FIG. 8B illustrates a front, cross-sectional view of the metrology assembly of FIG. 8A along section line C-C.

DETAILED DESCRIPTION

Overview

Figure 1:
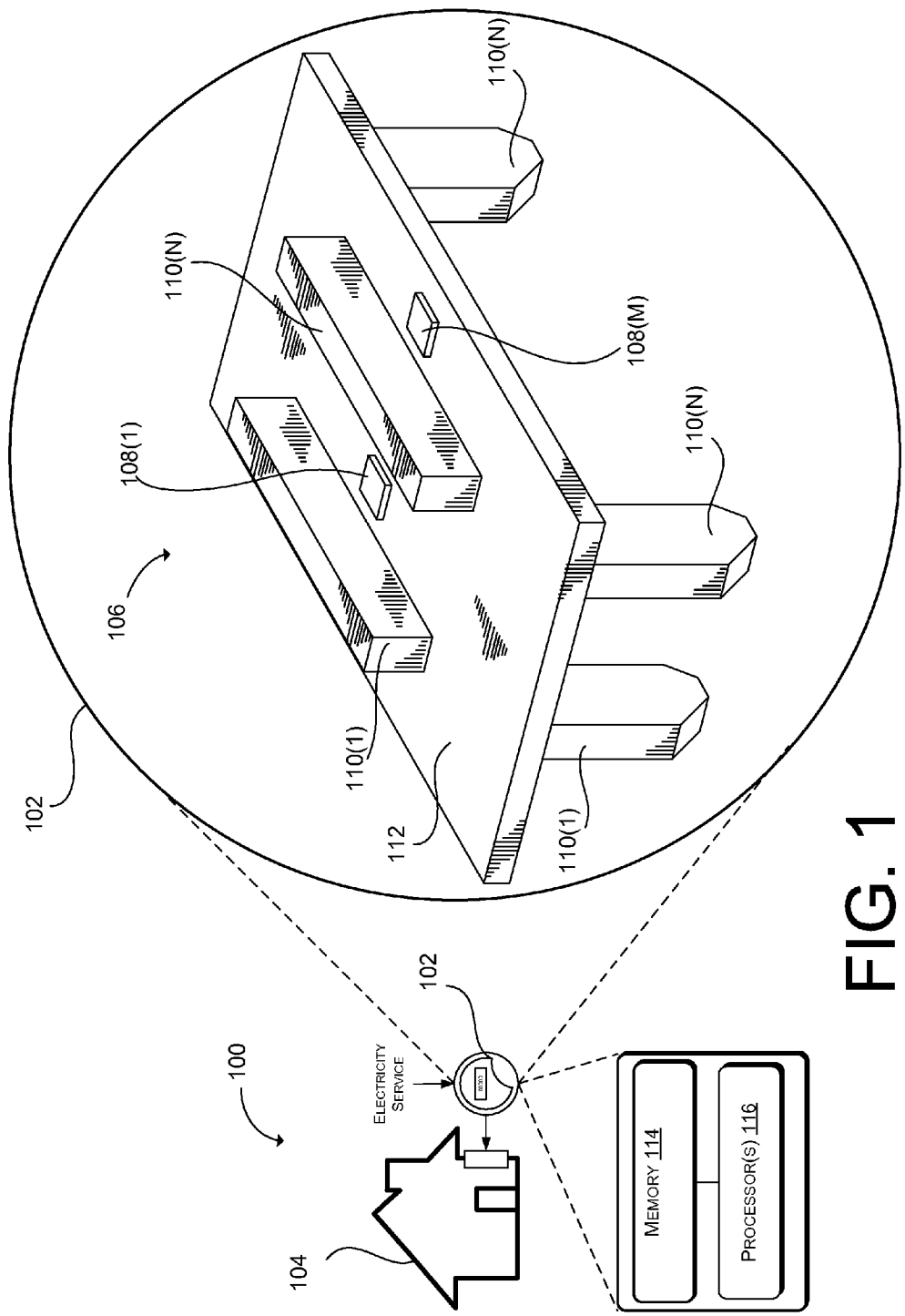
FIG. 1 is a schematic diagram of an example implementation of an electricity meter at a site for measuring electricity consumption at the site. The electricity meter in this example includes a metrology assembly with a multi-Hall effect device configuration, the metrology assembly being shown from a perspective view.

Disclosed herein is a metrology assembly including a multi-Hall effect device configuration. The embodiments disclosed herein are described, by way of example and not limitation, with reference to metrology implemented in electricity meters used for measuring electricity consumption at a site, such as a residence, business, facility, or other site. However, it is to be appreciated that the metrology assembly may be used in other suitable devices and applications, such power monitoring electronic devices or other similar metrology applications. As used herein, a "site" means a residence, a business, or any other location to which electricity service is provided.

As described above, traditional Hall-based metrology devices that use a magnetic concentrator (e.g., an iron core) in the Hall-based metrology device are susceptible to tampering, such as by a DC magnet attack. The metrology assembly according to the embodiments disclosed herein utilizes a multi-Hall effect device configuration that eliminates the necessity for a magnetic concentrator. In this sense, the metrology assembly disclosed herein is sometimes referred to as a "coreless" Hall-based metrology assembly because the typical iron core of the magnetic concentrator is omitted from the configuration disclosed herein. The metrology assembly may include a substrate or support platform configured to support at least two Hall effect devices per phase of a single-phase, bi-phase or poly-phase electricity meter. Accordingly, the metrology assembly includes one or more electrical conductors (the number of electrical conductors corresponding to the number of phases) coupled to the substrate and configured to conduct electric current. The Hall effect devices may be mounted or otherwise coupled to the substrate at opposing sides of an associated electrical conductor, such that each of the Hall effect devices is configured to detect a magnetic field created by the electric current of the associated electrical conductor, and to generate an output.

By eliminating the magnetic concentrator of traditional Hall-based metrology devices, tampering in the form of DC magnet attacks may be prevented because there is no longer magnetic material to be affected by such a magnet attack. Additionally, the metrology assembly including the multi-Hall effect device configuration disclosed herein greatly reduces the effect of both external AC fields and cross-talk between phases (i.e., the influence from magnetic fields generated by other phases) even though the magnetic concentrator is no longer provided to shield the Hall effect devices from external AC fields. Furthermore, utilization of the substrate disclosed herein provides for a rigid platform on which the components of the metrology assembly may be fixedly positioned relative to each other. Use of the substrate with the metrology assembly also minimizes the precision required for mounting the Hall effect devices relative to the electrical conductor. That is, predefined positions and orientations for the Hall effect devices can be specified on the substrate so that the process of mounting the Hall effect devices, as well as the electrical conductors, on the substrate can be easily automated, which in turn facilitates repeatability in automated manufacturing and assembly to reduce manufacturing complexity and cost.

Multiple and varied example implementations and embodiments are described below. However, these examples are merely illustrative, and other implementations and embodiments may be used to measure current in an electricity meter.

Example Implementation

FIG. 1 is a schematic diagram of an example implementation 100 of an electricity meter at a site to measure electricity consumption at the site using, at least in part, a metrology assembly with a multi-Hall effect device configuration. An electricity meter 102 may be associated with a site 104, such as a residence where electricity service is provided from a utility service provider. The electricity meter 102 may be one of multiple electricity meters associated with multiple sites serviced by one or more utility service providers. These utility service providers may implement a utility communication network to communicate data, such as electricity consumption data, between the plurality of sites and a central office. In this sense, the electricity meter 102 may, in some embodiments, be a "networked" device, or smart utility meter, configured to communicate data over a network including one, or a combination, of a wide area network (WAN), metropolitan area network (MAN), local area network (LAN), neighborhood area network (NAN), home area network (HAN), personal area network (PAN), or the like. Accordingly, the electricity meter 102 may include a communication module configured to communicate (using various modes of communication) with network edge or endpoints and/or one or more other electricity meters.

Electricity consumption at the site 104 is generally detected and measured using metrology included within, or otherwise associated with, the electricity meter 102. The metrology may be any of a variety of hardware and/or software usable to sense and measure electricity consumption data of the site 104, which data may then be communicated by the communication module to a central office for reporting purposes, and the like.

Example Metrology Assembly

The metrology of the electricity meter 102 may include a metrology assembly 106 which may represent at least a portion of the hardware used by the metrology to detect and measure electricity consumption. The metrology assembly 106 may include multiple Hall effect devices 108(1) to 108(M) (collectively referred to as "Hall effect devices 108"), such as sensors, detectors, transducers, etc., configured to detect a magnetic field created by electric current carried in an associated electrical conductor, such as electrical conductors 110(1) to 110(N). Here, the Hall effect device 108(1) is one of multiple Hall effect devices associated with the electrical conductor 110(1), while the Hall effect device 108(M) is one of multiple Hall effect devices associated with the electrical conductor 110(N). In the configuration shown in FIG. 1, each electrical conductor 110(1)-(N) corresponds to a phase of the electricity meter 102 such that multiple Hall effect devices are associated with each phase of the electricity meter 102. Alternatively, multiple Hall effect devices (e.g., two Hall effect devices) may be associated with multiple phases of the electricity meter 102. The electricity meter 102 may be a single-phase, bi-phase, or poly-phase meter. FIG. 1 shows two electrical conductors 110(1) and 110(N), which may correspond to two phases of a bi-phase electricity meter 102. It is to be appreciated that the electricity meter 102 may implement any number of phases, and that multiple Hall effect devices (at least two) are associated with each phase. Furthermore, although the electrical conductors 110(1)-(N) are depicted as being arranged linearly, the arrangement or layout of the electrical conductors is not specific to the disclosed metrology assembly 106.

The Hall effect devices 108(1)-(M) may be coupled to a substrate 112, or support platform, which may include a printed circuit board (PCB), or any other type of support member configured to support the Hall effect devices 108(1)-(M) that are coupled thereto. The Hall effect devices 108(1)-(M) may be coupled or mounted to the substrate 112 by any suitable means, such as by surface mount or through hole mounting techniques known to a person having ordinary skill in the art, or by attachment to the substrate 112 via fasteners (e.g., pins, screws, rivets, etc.), adhesive, etc. The position of the Hall effect devices 108(1)-(M) on the substrate 112 may be such that multiple (e.g., two) Hall effect devices 108(1)-(M) are positioned proximate to each of the electrical conductors 110(1)-(N), and on each side of the electrical conductors. For example, one of the Hall effect devices, such as Hall effect device 108(1) may be positioned proximate to, and on one side of, the electrical conductor 110(1). Another Hall effect device may be positioned on the opposite side of the electrical conductor 110(1), as shown in more detail in the following figures. Accordingly, multiple Hall effect devices may be associated with the electrical conductor 110(1). Similarly, multiple Hall effect devices may be associated with the electrical conductor 110(N) corresponding to another phase of the electricity meter 102. Alternatively, multiple Hall effect devices (e.g., two Hall effect devices) may each be positioned on opposite sides of the substrate 112 for one or more phases of the electricity meter 102. For example, one Hall effect device on each side of the substrate 112 may reduce the effects of coil movement on gain, which may, in turn, lead to less total gain and a more robust configuration.

The Hall effect devices 108(1)-(M) may each be part of an integrated circuit (IC) which may include at least a portion of circuitry used to process and condition the sensed electricity consumption data, such as by using compensation circuits, amplifier circuits, filter circuits, etc. Such circuitry may improve the performance of the Hall effect devices 108(1)-(M) when implemented for detecting current in the electrical conductors 110(1)-(N).

Each of the electrical conductors 110(1)-(N) may be coupled to the substrate 112 and configured to conduct, or carry, electric current. FIG. 1 shows the electrical conductors 110(1)-(N) as having a cross-sectional shape that is rectangular, or otherwise flat (i.e., not round/cylindrical). This generally flat cross-sectional shape of the electrical conductors 110(1)-(N) creates zones or spaces having a more uniform/homogeneous magnetic field than would be created by a round/circular cross-sectional shaped electrical conductor. That is, the magnetic field strength decreases substantially linearly as the distance from the electrical conductor 110 increases in a horizontal direction. However, it is to be appreciated that the electrical conductors 110(1)-(N) may be of any suitable shape, or cross-sectional geometry, such as triangular, hexagonal, etc., or a non-uniform cross-sectional shape. Various height to width ratios of the cross-sectional geometry may yield optimized magnetic field shape created by each of the electrical conductors 110(1)-(N). That is, the shape of the electrical conductors 110(1)-(N) may influence the shape of the magnetic field surrounding them. In general, a ratio of width to height of the cross-section that is less than one is preferred. The electrical conductors 110(1)-(N) may be made of any material or combination of materials suitable for conducting electricity, such as copper, silver, gold, platinum, etc.

In some embodiments, the electrical conductors 110(1)-(N) are coupled to the substrate 112 via a top portion of the electrical conductors 110(1)-(N) being received through slots, or apertures, in the substrate 112. In this configuration, the electrical conductors 110(1)-(N) may generally be U-shaped such that the top portions of the electrical conductors 110(1)-(N) are received through the slots in the substrate 112 while the leg portions of the U-shaped electrical conductors 110(1)-(N) extend downward from the substrate 112. The legs of the electrical conductors 110(1)-(N) may be secured to a base in the electricity meter 102 for fixedly positioning the metrology assembly 106.

During operation of the electricity meter 102, outputs generated by each of the Hall effect devices 108(1)-(M) may be delivered to one or more modules stored in a memory 114 of the electricity meter 102. The memory 114 may be configured to store one or more software and/or firmware modules, which are executable on one or more processors 116 to implement various functions. For instance, the output signals generated by the Hall effect devices 108(1)-(M) may be collected and analyzed with aggregated metrology data. The memory 114 may further include one or more libraries or data stores for storage of the metrology data. This and other data may be processed by the one or more processors 116 of the electricity meter 102, which may include one or more microprocessors, microcontrollers, or other processing device configured to execute software and/or firmware modules stored in the memory.

The memory 114 is an example of computer-readable media and may take the form of volatile memory, such as random access memory (RAM) and/or non-volatile memory, such as read only memory (ROM) or flash RAM. Computer-readable media includes volatile and non-volatile, removable and non-removable media implemented in any method or technology for storage of information such as computer-readable instructions, data structures, program modules, or other data for execution by one or more processors of a computing device. Examples of computer-readable media include, but are not limited to, phase change memory (PRAM), static random-access memory (SRAM), dynamic random-access memory (DRAM), other types of random access memory (RAM), read-only memory (ROM), electrically erasable programmable read-only memory (EEPROM), flash memory or other memory technology, compact disk read-only memory (CD-ROM), digital versatile disks (DVD) or other optical storage, magnetic cassettes, magnetic tape, magnetic disk storage or other magnetic storage devices, or any other non-transmission medium that can be used to store information for access by a computing device. As defined herein, computer-readable media does not include modulated data signals and carrier waves.

While certain functions and modules are described herein as being implemented by software and/or firmware executable on a processor, in other embodiments, any or all of the modules may be implemented in whole or in part by hardware (e.g., as an ASIC, FPGA, a specialized processing unit, etc.) to execute the described functions. In some instances, one or more processors, memory, ASICs, or other software, hardware, and/or firmware of the meter may be referred to as a processing unit.

Figure 2:
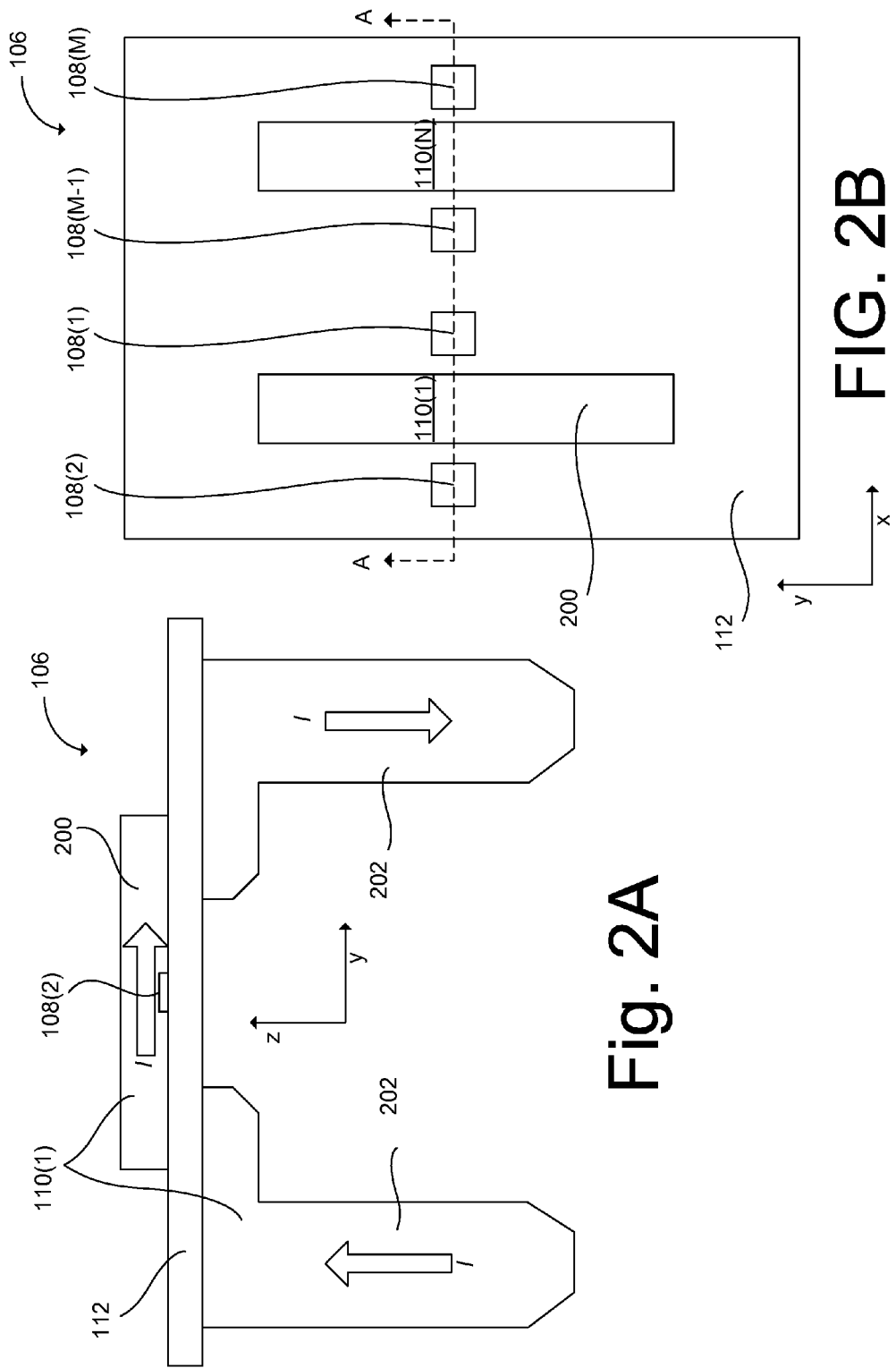
FIG. 2A illustrates a side view of the example metrology assembly of FIG. 1.
FIG. 2B illustrates a top view of the example metrology assembly of FIG. 1.

FIGS. 2A and 2B illustrate side and top views, respectively, of the metrology assembly 106 of FIG. 1. The metrology assembly 106 may comprise one or more electrical conductors, such as the electrical conductors 110(1)-(N). The side view of FIG. 2A shows one of the electrical conductors 110(1) with an electric current, I, flowing through it. The electrical conductor 110(1) may be generally U-Shaped, such as in the form of an inverted "U" letter. A top portion 200 of the electrical conductor 110(1) may be received within a slot of the substrate 112 in order to couple the electrical conductor 110(1) to the substrate 112. Additional mechanical coupling means may be used to further secure the electrical conductor 110(1) in fixed relation to the substrate 112, such as by using adhesive, pins, solder, or other bonding type material. Other fastening or mounting mechanisms may additionally or alternatively be used, such as clamps, or tabs, to fixedly secure the electrical conductor 110(1) to the substrate 112. Legs 202 of the electrical conductor 110(1) may offer support to the substrate 112, but the substrate 112 may be separately supported by other means, such as posts or similar supports in a base frame of the electricity meter 102 so that the support from the electrical conductor 110(1) is not necessary. A Hall effect device 108(2)—which may be one of multiple Hall effect devices (e.g., 108(1) and 108(2)) associated with the electrical conductor 110(1)—may be coupled to the substrate 112 in a position proximate to the electrical conductor 110(1), such as adjacent to the top portion 200. The Hall effect device 108(1) of FIG. 1 may be positioned on the opposite side of the top portion 200 of the electrical conductor 110(1), as shown in FIG. 2B. This arrangement may be repeated for multiple other phases of the electricity meter 102, up to N phases.

Figure 3:
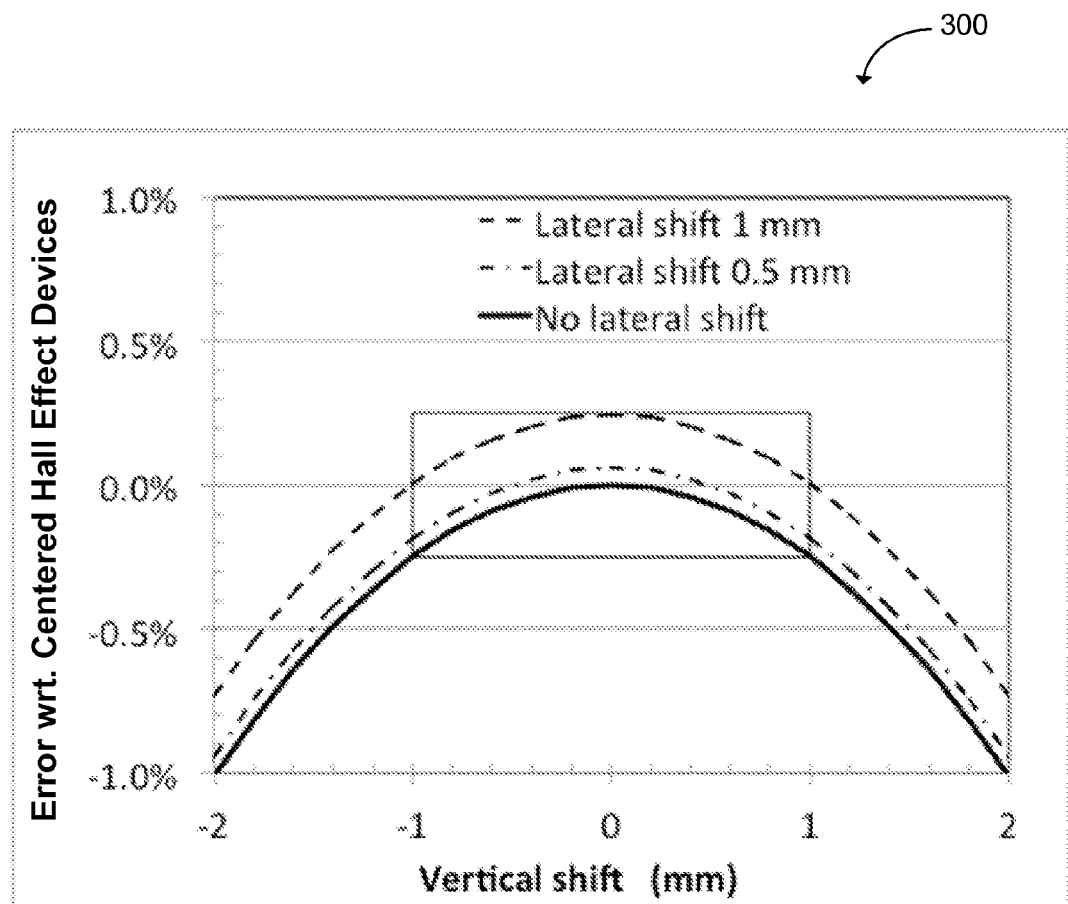
FIG. 3 is a graph showing example idealized output that would be generated by multiple Hall effect devices associated with an infinitesimally thin electrical conductor, which shows the effect of vertical and lateral displacement or shift of the Hall effect devices.

FIG. 3 is a graph 300 showing idealized outputs that would be generated by multiple Hall effect devices, such as the Hall effect devices 108(1) and 108(2), associated with an infinitesimally thin electrical conductor. FIG. 3 shows the effect of vertical and lateral displacement or shift of the Hall effect devices with respect to a configuration of the metrology assembly 106 shown in FIGS. 1 and 2. Particularly, FIG. 3 illustrates that by displacing the position of the Hall effect devices 108(1) and 108(2) in a vertical direction (i.e., z-direction shown in FIG. 2A) relative to the plane of the substrate 112, the error with respect to the pair of Hall effect devices 108(1),(2) is negligible across relatively small vertical displacements and holds true for the lateral shifts of the Hall effect devices 108(1),(2), as shown in the graph 300 of FIG. 3 by the box shown in the center of the graph 300. In other words, the output generated from the pair of Hall effect devices 108(1),(2) is substantially independent of vertical shift of the Hall effect devices 108(1),(2) relative to the plane of the substrate 112. This is primarily due to the cross-sectional shape of the electrical conductors 110(1)-(N) which influences the shape of the magnetic field around each electrical conductor 110(1)-(N) to dictate the effect of vertical displacement. This demonstrates that the vertical placement of the Hall effect devices 108(1)-(M) within the vicinity of the electrical conductors 110(1)-(N) can be varied to an extent without substantially affecting measurement accuracy. Furthermore, by summing the output signals from multiple (e.g., two) Hall effect device 108(1)-(M), the influence of external magnetic fields (e.g., magnetic fields from other phases within the electricity meter 102, magnetic fields outside of the electricity meter 102, etc.) is substantially rejected, or canceled out, as will be described in more detail below. Additionally, by fixing the distance between the two Hall effect devices 108(1),(2) by, for example, mounting the Hall effect devices on a single substrate 112, the output of the pair of Hall effect devices 108(1),(2) is substantially insensitive to relative movement of the associated electrical conductor, such as the electrical conductor 110(1), as shown in FIG. 3. This insensitivity to vertical displacement of the Hall effect devices 108(1)-(M) relative to the electrical conductors 110(1)-(N), in turn, facilitates automated manufacturing processes for coupling the Hall effect devices 108(1)-(M) and the electrical conductors 110(1)-(N) to the substrate 112 because tolerances to achieve suitable measurement accuracy can be increased.

Figure 4:
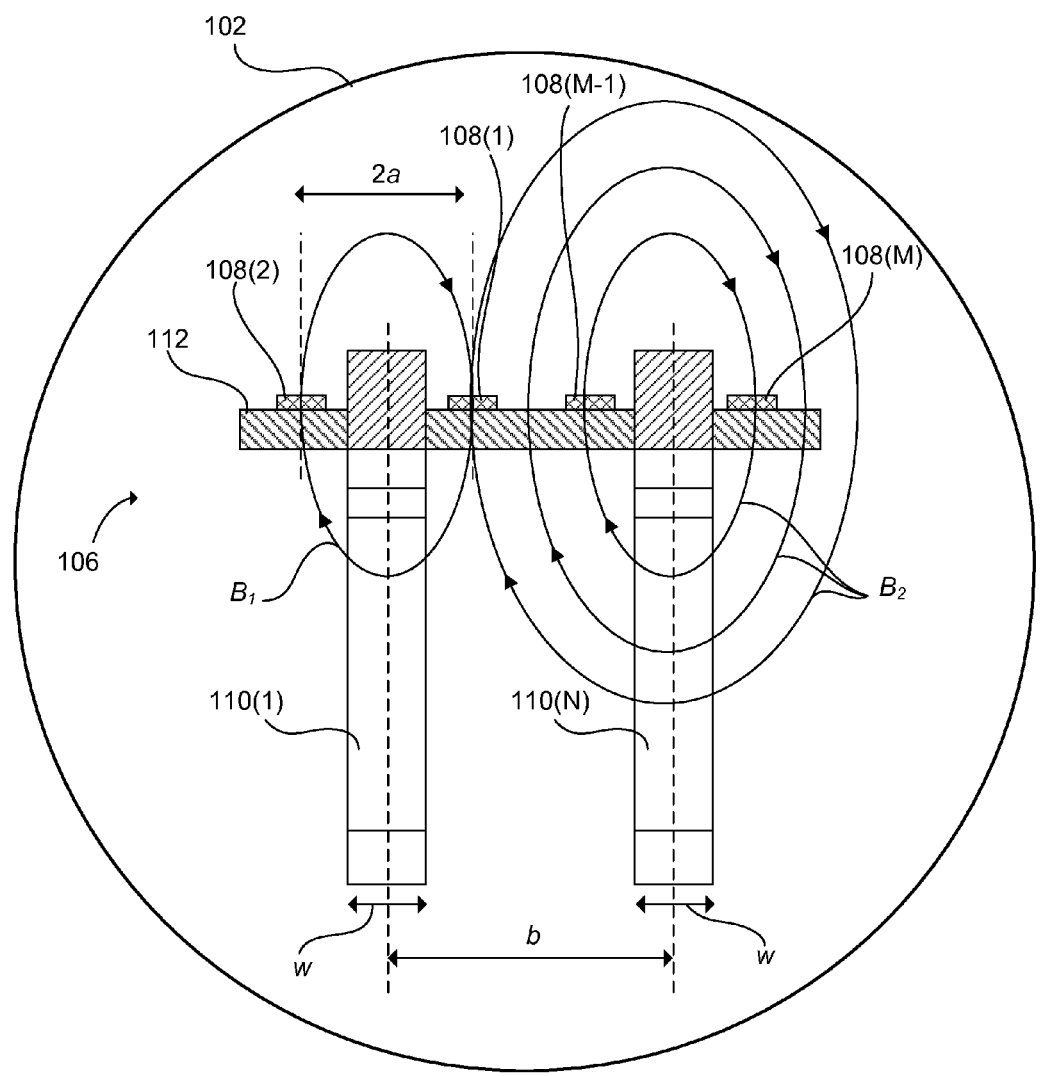
FIG. 4 illustrates a front, cross sectional view of the example metrology assembly along section line A-A of FIG. 2B, where cross-talk between phases of the electricity meter is demonstrated.

In some embodiments, the electricity meter 102 is a multi-phase (i.e., two or more phases) electricity meter. FIG. 4 illustrates a front, cross sectional view of the metrology assembly 106 along section line A-A of FIG. 2B. The metrology assembly 106 is shown with two electrical conductors 110(1) and 110(N), although it is to be appreciated that N may represent any number of electrical conductors 110(1)-(N). For illustrative purposes, the metrology assembly 106 in FIG. 4 will be referred to as being implemented in a bi-phase electricity meter 102 including two electrical conductors, namely electrical conductors 110(1) and 110(N).

When there are multiple phases in an electricity meter 102, the Hall effect devices 108(1) and 108(2) that are associated with a first phase may experience "cross-talk" from the other/second phase. That is, the Hall effect devices 108(1) and 108(2) will be somewhat influenced by the magnetic field, $B_2$, generated by the electrical conductor 110(N), in the example of FIG. 4. Although, FIG. 4 shows more field lines with respect to the magnetic field, B2, of the second phase (i.e., electrical conductor 110(N)) than the magnetic field, B1, of the first phase (i.e., electrical conductor 110(1)), this is done solely for illustrative purposes to show the effect of cross-talk on the first phase. The magnetic field lines in FIG. 4 are merely a portion of the actual field lines to represent the magnetic fields around each of the electrical conductors 110(1)-(N). Each Hall effect device 108(1) and 108(2) is configured to detect a magnetic field and generate an output in the form of a voltage; $V_{H108(1)}$ for Hall effect device 108(1) and $V_{H108(2)}$ for Hall effect device 108(2). For a bi-phase electricity meter 102, as shown in FIG. 4, the output $V_{H108(2)}$ and $V_{H108(1)}$ may be calculated by Equations (1) and (2) as follows:

$$V_{H108(2)} \propto \frac{\mu_0}{2\pi a} I_1 + \frac{\mu_0}{2\pi(b-a)} I_2 \quad (1)$$

$$V_{H108(1)} \propto -\frac{\mu_0}{2\pi a} I_1 + \frac{\mu_0}{2\pi(b+a)} I_2 \quad (2)$$

Here, $I_1$ represents the electric current flowing in the first phase, or electrical conductor 110(1), $I_2$ represents the electric current flowing in the second phase, or electrical conductor 110(N), $\mu_0$ is the magnetic constant, b is the distance between a centerline of the electrical conductor 110(1) and a centerline of the electrical conductor 110(N), and a is half of the distance between centerlines of the pair of Hall effect devices 108(1),(2), as shown in FIG. 4. The combined Hall signal output of the first phase, $V_1$, may then be calculated by Equation (3) as follows:

$$V_1 \propto V_{H108(2)} - V_{H108(1)} = \frac{\mu_0}{\pi a}\left(I_1 + \frac{a^2}{(b^2 - a^2)} I_2\right) \quad (3)$$

An approximation of the combined Hall signal output of the first phase, $V_1$, may be made according to Equation (4) as follows:

$$V_1 \approx \frac{\mu_0}{\pi a}\left(I_1 + \frac{a^2}{b^2} I_2\right) \quad (4)$$

The approximation Equation (4) illustrates the fact that cross-talk between phases of a multi-phase electricity meter 102 is greatly reduced, or negligible, with the metrology assembly disclosed herein, such as the metrology assembly 106 of FIGS. 1-4. For example, given b=70 millimeters (mm), and a=3.5 mm, the gain term $$\frac{a^2}{b^2}$$

of Equation (4) is equal to 0.0025 (or 0.25%). This gain term is stable for the configuration of the metrology assembly 106 shown in FIG. 4, and it is also relatively small. Therefore, if, for example, 1 ampere of current is flowing in the first and second phase of the electricity meter 102, the current measured by the Hall effect devices 108(1),(2) associated with the first phase will be approximately 1.0025 amperes, which is 0.0025 amperes greater than the actual current flow in the first phase due to the effect of cross-talk between phases. By knowing the constraints of the metrology assembly 106, the gain term of 0.0025 can be calculated and subtracted from the measured signal to get the actual current flow of 1 ampere in the first phase. However, in many instances, the cross-talk between phases may be negligible and need not be accounted for.

Figure 5:
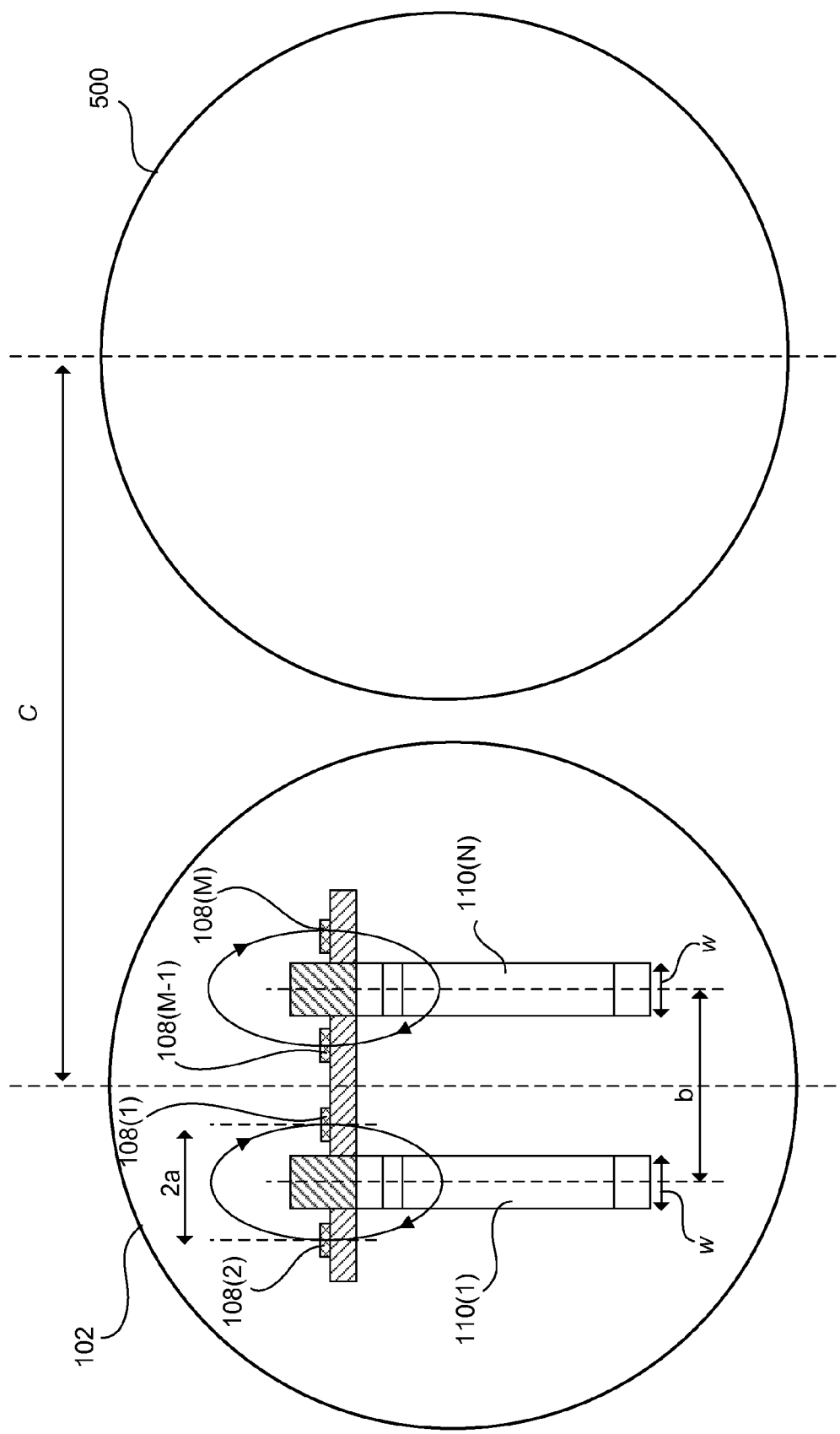
FIG. 5 illustrates the front, cross sectional view of the example metrology assembly of FIG. 4 along with another electricity meter a distance from the metrology assembly, where the effect of external AC fields on the metrology assembly is demonstrated.

An electricity meter, such as the electricity meter 102, may further be influenced by external AC fields, such as external current from another nearby electricity meter 500, as shown in FIG. 5. The metrology assembly disclosed herein greatly reduces the effect of external AC fields as illustrated with reference to FIG. 5. For two conventional size electricity meters, such as the electricity meter 102 and the electricity meter 500, the distance, C, between centerlines of the electricity meters 102 and 500 is constrained by interference between the housings of the electricity meters 102 and 500 such that the minimum distance of C can be approximated to around 20 centimeters (cm). Given this constraint, it can be approximated that the contribution of the external AC field created by the external electricity meter 500 is at most=

$$\left(\frac{a}{(b-C)}\right)^2 = 0.07\%$$

(continuing with the example dimensions for a and b discussed above with reference to FIG. 4). This can also be explained by the following Matrix Equation (5), which shows the global Hall signal output of the electricity meter 102 as:

$$\text{Global Hall Output} = \begin{pmatrix} V_1 \\ V_2 \end{pmatrix} = \begin{pmatrix} K_{11} & k_{12} & k_{1ext} \\ k_{21} & K_{22} & k_{2ext} \end{pmatrix} \begin{pmatrix} I_1 \\ I_2 \\ I_{ext} \end{pmatrix} \quad (5)$$

Here, $V_1$ and $V_2$ represent the combined Hall signal outputs of the first phase and the second phase, respectively, of the electricity meter 102. $I_1$ and $I_2$ are the electric currents of the first phase and the second phase, respectively, of the electricity meter 102, and $I_{ext}$ is the electric current of the electric meter 500, which is unknown in practice. Furthermore, $K_{11}$, $k_{12}$, $k_{21}$ and $K_{22}$ are known coefficients relating to the electricity meter 102, and they are determined by using the approximation Equation (4), above, for each phase. Lastly, $k_{1ext}$ and $k_{2ext}$ are unknown coefficients relating to the electricity meter 500.

Notably, continuing with the above example of the electricity meter 102 shown in FIGS. 4 and 5, $$\frac{k_{12}}{K_{11}} \approx 0.0025,$$

and we can approximate the maximum possible contribution of the external AC field from the electricity meter 500 to be $$\frac{k_{1ext}}{K_{11}} \approx 0.0007.$$

This illustrates that the effect of external AC fields on the metrology assembly of the embodiments disclosed herein is even smaller than the effect of cross-talk between phases, and is therefore negligible. In fact, by narrowing a width, w, of the electrical conductors 110(1) and 110(N), at least at a section that is local to the Hall effect devices 108(1),(2),(M−1),(M), the length of dimension, a, can be made even smaller, thereby reducing further the effect of external AC fields. Accordingly, in some examples it may be beneficial to make the electrical conductors 110(1)-(N) as thin as possible with respect to the width, w, shown in FIGS. 4 and 5. In some embodiments, the dimension, a, is in the range of 2 millimeters to 4 millimeters. However, by making the entire electrical conductors 110(1)-(N) too thin, the internal resistance of the electrical conductors 110(1)-(N) will become unsuitably high for the purposes of conducting current therein. Therefore, localized narrowing (i.e., local to the position of the Hall effect devices 108(1)-(M) associated with the electrical conductors 110(1)-(N)) of the electrical conductors 110(1)-(N) may be used to provide the benefit of reduced influence of external AC fields, while limiting the increase in internal resistance of the electrical conductors 110(1)-(N) caused by narrowing of the width, w, of the electrical conductors 110(1)-(N). Multiple embodiments describing example variable-width electrical conductors will be described further below.

Figure 6:
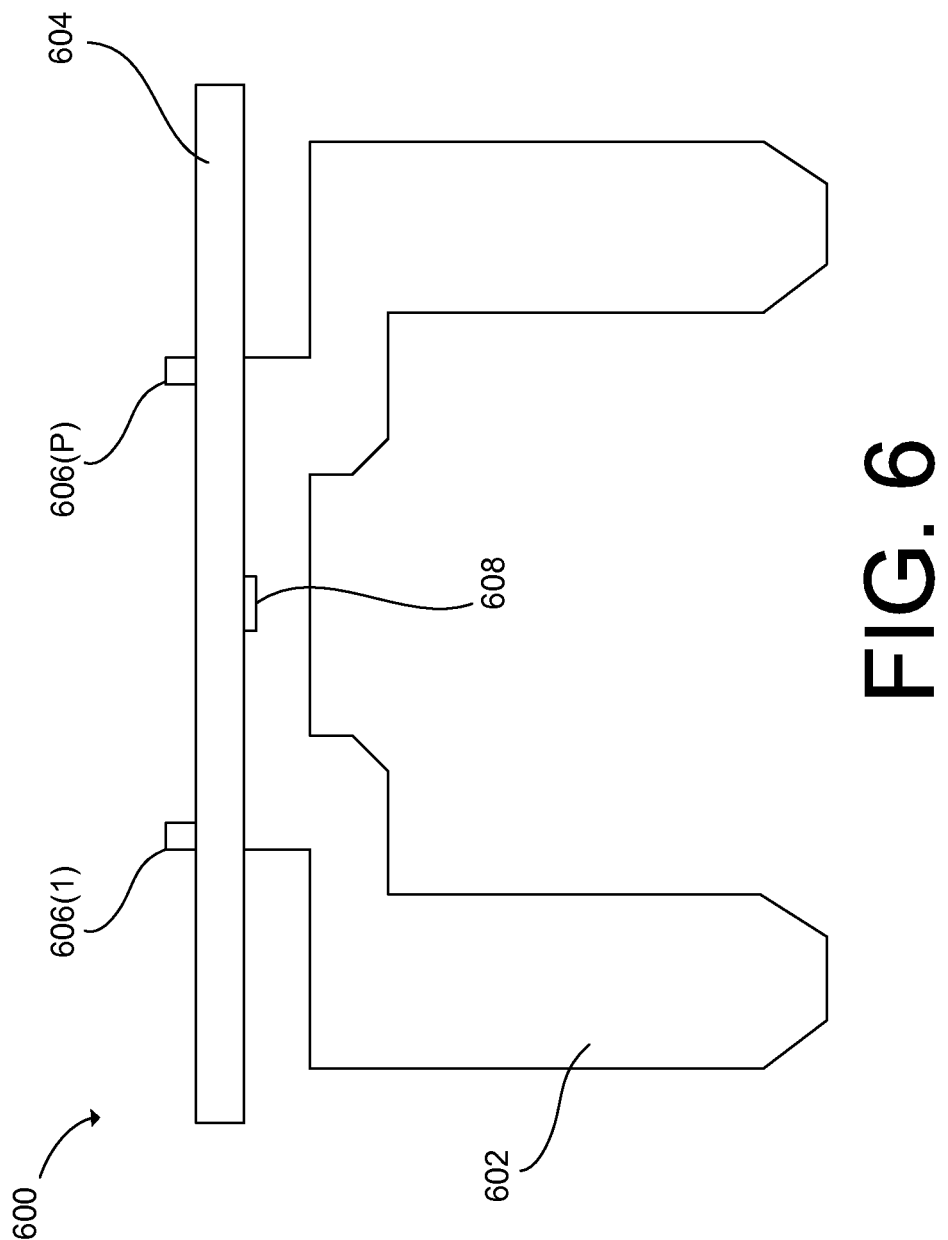
FIG. 6 illustrates a side view of an example metrology assembly according to another embodiment, the metrology assembly including a substrate to support multiple Hall effect devices on an underside of the substrate.

FIG. 6 illustrates a side view of an example metrology assembly 600 according to another embodiment. The metrology assembly 600 may include one or more electrical conductors, such as electrical conductor 602, coupled to a substrate 604, such as a PCB or similar support structure. The electrical conductor 602 is shown to be generally U-shaped from the side view of FIG. 6. The electrical conductor 602 may include multiple tabs 606(1) to 606(P) protruding from a top portion of the electrical conductor 602. These tabs 606 (1)-(P) are configured to facilitate the coupling of the electrical conductor 602 to the substrate 604 by being received through holes, or apertures, in the substrate 604. Any number P of tabs may be implemented without changing the basic characteristics of the assembly, and FIG. 6 illustrates two exemplary tabs 606(1) and 606(P) for illustrative purposes. Additional coupling means may be utilized to facilitate even more rigid coupling of the electrical conductor 602 to the substrate 604, such as adhesive, solder, or a similar bonding material, as well as fasteners (e.g., tabs, clamps, and the like). Furthermore, although FIG. 6 shows only a single electrical conductor 602 from the side view of the metrology assembly 600, any number of electrical conductors may be provided in the metrology assembly 600 of FIG. 6, such as electrical conductors corresponding to each phase in a multi-phase electricity meter.

The metrology assembly 600 may further comprise multiple Hall effect devices, such as Hall effect device 608, coupled to the substrate 604. Specifically, FIG. 6 shows the Hall effect device 608 coupled to the substrate 604 on an underside of the substrate 604 so that it is suitably positioned in relation to the electrical conductor 602 for measuring current flow in the electrical conductor 602. At least one other Hall effect device may be provided on the opposite side of the electrical conductor 602 and may be coupled to the substrate 604. For a multi-phase electricity meter, multiple Hall effect devices may be associated with each electrical conductor corresponding to the multiple phases of the electricity meter.

FIGS. 7A and 7B illustrate side and front, cross-sectional (section line B-B) views, respectively, of an example metrology assembly 700 according to another embodiment. The metrology assembly 700 may comprise one or more electrical conductors, such as electrical conductor 702, each including a slot 704, or aperture, configured to receive a substrate 706, such as a PCB or similar support structure. The substrate 706 may be positioned at generally the center of the cross section of the electrical conductor 702 and may be rigidly fixed to a bottom side of the slot 704 by any suitable coupling means, such as adhesive or similar bonding material, as well as fasteners (e.g., pins, clamps, screws, etc.). The slot 704 may be sized to provide for clearance of the substrate 706 when disposed within the slot 704, or it may be sized to provide little-to-no additional clearance beyond the thickness of the substrate 706. Multiple Hall effect devices 708 and 710 may be coupled to the substrate 706 such that they are positioned at opposite sides of the electrical conductor 702, as shown in FIG. 7B.

FIGS. 8A and 8B illustrate side and front, cross-sectional (section line C-C) views, respectively of an example metrology assembly 800 according to another embodiment. The metrology assembly 800 may comprise one or more electrical conductors, such as electrical conductor 802, coupled to a substrate 804, or support structure. Specifically, the electrical conductor 802 is shown to be coupled to the substrate 804 by virtue of the substrate 804 being generally U-shaped, as shown in FIG. 8B, and the substrate 804 surrounding an underside of the electrical conductor 802. Multiple Hall effect devices 806 and 808 may be coupled to the substrate 804 such that they are positioned at opposite sides of the electrical conductor 802, as shown in FIG. 8B.

Figure 9:
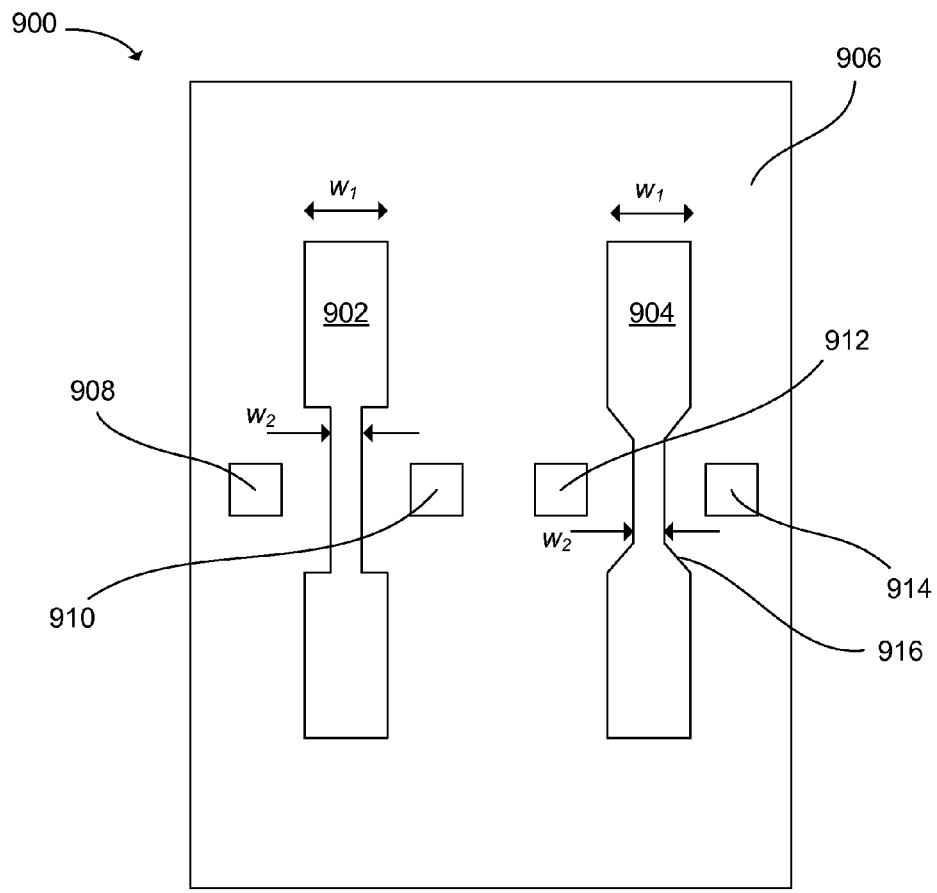
FIG. 9 illustrates a top view of an example metrology assembly according to alternate embodiments showing multiple electrical conductors with variable width cross sections.

FIG. 9 illustrates a top view of an example metrology assembly 900 according to additional embodiments. Specifically, the metrology assembly 900 illustrates electrical conductors having variable cross-sectional widths, such as electrical conductor 902 and electrical conductor 904. It is to be appreciated that while two differently shaped electrical conductors (i.e., electrical conductors 902 and 904) are shown in FIG. 9, FIG. 9 is meant to represent two different embodiments which may, but need not necessarily, be used together in practice. The electrical conductors 902 and 904 may be coupled to a substrate 906 by any of the aforementioned techniques described herein. Additionally, multiple Hall effect devices may be associated with each of the electrical conductors 902 and 904. For instance, Hall effect devices 908 and 910 may be associated with the electrical conductor 902, while Hall effect devices 912 and 914 may be associated with the electrical conductor 904. The Hall effect devices 908 and 910 may be positioned on each side of the electrical conductor 902, and the Hall effect devices 912 and 914 may be positioned on each side of the electrical conductor 904, such that each pair of Hall effect devices 908,910 and 912,914 are positioned on opposite sides of their associated electrical conductor.

The electrical conductors 902 and 904 may predominantly have a cross-sectional width, $w_1$, extending substantially the entire length of the electrical conductors 902 and 904. The width, $w_2$, of each of the electrical conductors 902 and 904 may be smaller at a location where the Hall effect devices 908,910,912,914 are positioned next to the electrical conductors 902 and 904. In other words, the width reduction of the electrical conductors 902 and 904 from $w_1$ to $w_2$ may be localized at a position where the Hall effect devices 908,910, 912,914 are coupled to the substrate 906. This localized narrowing of the electrical conductors 902 and 904 provides the benefit of optimizing signal rejection from external AC fields, while further limiting the increased resistance characteristics from narrowing the electrical conductors 902 and 904. The width reduction may be an abrupt change in width, as shown for the electrical conductor 902, or it may be a gradual reduction in width, as shown for the electrical conductor 904 which comprises sloping surface 916 that gradually reduces the cross-sectional width of the electrical conductor 904. This sloping surface 916, may be of any suitable angle (e.g., between 0 and 90 degrees). An angle close to 90 degrees may provide for a maximized localization of the narrowing section of the electrical conductor 904, while a shallow, or more gradual, angle may reduce the localized mechanical stress of the electrical conductor 904 that could lead to breakage of the electrical conductor.

Figure 10:
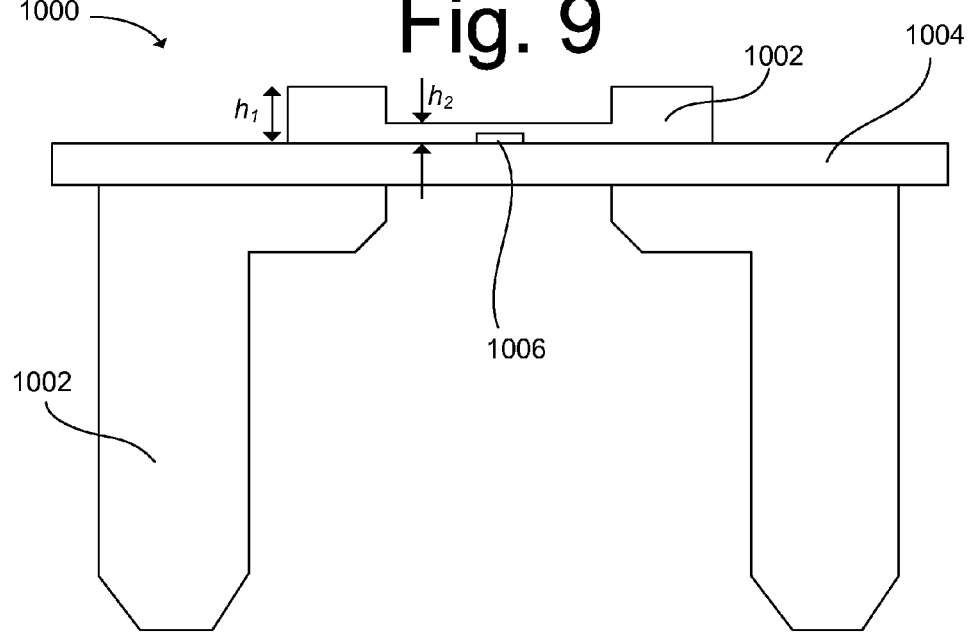
FIG. 10 illustrates a side view of an example metrology assembly according to another embodiment showing an electrical conductor with a variable height cross section.

FIG. 10 illustrates a side view of an example metrology assembly 1000 according to another embodiment. Specifically, the metrology assembly 1000 illustrates an electrical conductor 1002 having variable cross-sectional height. The electrical conductor 1002 may be coupled to a substrate 1004, such as a PCB or similar support structure. The electrical conductor 1002 may be generally U-shaped from the side view of FIG. 10. Multiple Hall effect devices, such as Hall effect device 1006, may be coupled to the substrate 1004 such that the Hall effect devices are positioned adjacent to the electrical conductor 1002, and on each side of the electrical conductor 1002. FIG. 10 illustrates that the electrical conductor 1002 may have a cross-sectional height, $h_1$, along portions of the electrical conductor that are further from the Hall effect device 1006, while the height local to the position of the Hall effect device 1006 may be reduced to a height, $h_2$, that is smaller than $h_1$. The reduction in height is shown as being abrupt in FIG. 10, but it may also be gradual, such as by defining a slope or similar contour in the electrical conductor 1002 to reduce the height of the electrical conductor where the Hall effect devices are positioned.

Conclusion

Although the application describes embodiments having specific structural features and/or methodological acts, it is to be understood that the claims are not necessarily limited to the specific features or acts described. Rather, the specific features and acts are merely illustrative some embodiments that fall within the scope of the claims of the application.

What is claimed is:

1. A metrology assembly comprising:
a substrate having a top side, an underside, and a slot;
one or more U-shaped electrical conductors configured to conduct electric current, each U-shaped electrical conductor comprising:
a top portion having a length and a width; and
two substantially parallel leg portions that are connected together at one end by the top portion to form a U-shape such that the length of the top portion spans at least a portion of a distance between the two substantially parallel leg portions,
wherein each U-shaped electrical conductor is coupled to the substrate by the top portion being disposed through the slot in the substrate, a length of the slot spanning at least the length of the top portion, and a width of the slot spanning at least the width of the top portion, wherein the top portion is disposed on the top side of the substrate, and the two substantially parallel leg portions are disposed on the underside of the substrate;
an additional electrical conductor having an aperture through a width of the additional electrical conductor, the additional electrical conductor being coupled to the substrate by the substrate being disposed through the aperture; and
at least two Hall effect devices associated with an electrical conductor of at least one of the additional electrical conductor or the one or more U-shaped electrical conductors, the at least two Hall effect devices being coupled to the substrate and positioned at opposing sides of the electrical conductor, each of the at least two Hall effect devices configured to detect a magnetic field created by the electric current conducted in the electrical conductor and to generate an output.

2. The metrology assembly of claim 1, wherein the metrology assembly comprises a plurality of U-shaped electrical conductors, and at least one electrical conductor of the plurality of U-shaped electrical conductors is coupled to the substrate by multiple tabs extending from the top portion of the at least one electrical conductor through corresponding holes in the substrate, and wherein the at least two Hall effect devices are coupled to the substrate on the underside of the substrate.

3. The metrology assembly of claim 1, wherein the at least two Hall effect devices are coupled to the substrate at the top side of the substrate.

4. The metrology assembly of claim 1, wherein the substrate comprises a printed circuit board (PCB).

5. The metrology assembly of claim 1, wherein at least one of the one or more U-shaped electrical conductors has a substantially rectangular cross section.

6. The metrology assembly of claim 5, wherein the substantially rectangular cross section is at least one of a variable width cross section, or a variable height cross section.

7. The metrology assembly of claim 6, wherein the variable width cross section or the variable height cross section narrows where the at least two Hall effect devices are positioned.

8. The metrology assembly of claim 5, wherein a ratio of a width of the substantially rectangular cross section to a height of the substantially rectangular cross section of the electrical conductor is less than one, the ratio defining a shape of the magnetic field surrounding the electrical conductor such that the magnetic field includes one or more zones that are oriented perpendicular to a plane of the substrate where a strength of the magnetic field is substantially uniform.

9. A metering device comprising:
a support platform having a top side, an underside, and a slot;
an U-shaped electrical conductor having a substantially rectangular cross section and configured to carry electric current, the U-shaped electrical conductor comprising:
a top portion having a length and a width; and
two substantially parallel leg portions that are connected together at one end by the top portion to form a U-shape such that the length of the top portion spans at least a portion of a distance between the two substantially parallel leg portions,
wherein the U-shaped electrical conductor is coupled to the support platform by the top portion being disposed through the slot in the support platform, a length of the slot spanning at least the length of the top portion, and a width of the slot spanning at least the width of the top portion, wherein the top portion is disposed on the top side of the support platform, and the two substantially parallel leg portions are disposed on the underside of the support platform;
an additional electrical conductor having an aperture through a width of the additional electrical conductor, the additional electrical conductor being coupled to the support platform by the support platform being disposed through the aperture; and
at least two Hall effect devices associated with an electrical conductor of at least one of the additional electrical conductor or the U-shaped electrical conductor and coupled to the support platform such that the at least two Hall effect devices are positioned on opposite sides of the electrical conductor.

10. The metering device of claim 9, wherein the width of the U-shaped electrical conductor comprises a variable width that comprises a relatively smaller width portion proximate to a location of the at least two Hall effect devices.

11. The metering device of claim 10, wherein the variable width comprises a gradual reduction in the width of the U-shaped electrical conductor along the length of the U-shaped electrical conductor to the relatively smaller width portion and a gradual increase in the width of the U-shaped electrical conductor along the length of the U-shaped electrical conductor to a relatively larger width portion.

12. The metering device of claim 9, wherein the U-shaped electrical conductor has a variable height that comprises a relatively smaller height portion proximate to a location of the at least two Hall effect devices.

13. The metering device of claim 9, further comprising an additional U-shaped electrical conductor that is coupled to the support platform by multiple tabs extending from a top portion of the additional U-shaped electrical conductor disposed through corresponding holes in the support platform.

14. The metering device of claim 13, further comprising at least two additional Hall effect devices coupled to the support platform on the underside of the support platform and on opposite sides of the additional U-shaped electrical conductor.

15. The metering device of claim 9, wherein the support platform comprises a printed circuit board (PCB).

16. The metering device of claim 9, wherein the at least two Hall effect devices are separated by a predetermined distance in a range of 2 millimeters to 4 millimeters.

17. The metering device of claim 9, wherein the metering device is a multi-phase metering device comprising a plurality of electrical conductors including the U-shaped electrical conductor, and wherein the at least two Hall effect devices are positioned on opposite sides of individual ones of the plurality of electrical conductors.

18. The metering device of claim 9, wherein a ratio of a width of the substantially rectangular cross section to a height of the substantially rectangular cross section of the U-shaped electrical conductor is less than one, the ratio defining a shape of a magnetic field surrounding the U-shaped electrical conductor such that the magnetic field includes one or more zones that are oriented perpendicular to a plane of the support platform where a strength of the magnetic field is substantially uniform.

19. A metrology assembly comprising:
a plurality of conductors for conducting electric current associated with multiple phases of a metering device, at least one of the plurality of conductors comprising a U-shaped electrical conductor comprising:
a top portion having a length and a width; and
two substantially parallel leg portions that are connected together at one end by the top portion to form a U-shape such that the length of the top portion spans at least a portion of a distance between the two substantially parallel leg portions;
an additional electrical conductor of the plurality of conductors having an aperture through a width of the additional electrical conductor;
a plurality of detectors for detecting a magnetic field created by the plurality of conductors, the plurality of detectors being associated with, and positioned on opposite sides of, each of the plurality of conductors; and
a substrate having a top side, an underside, and a slot, the substrate being configured to rigidly support the plurality of detectors and the plurality of conductors, wherein the U-shaped electrical conductor is coupled to the substrate by the top portion being disposed through the slot in the substrate, a length of the slot spanning at least the length of the top portion, and a width of the slot spanning at least the width of the top portion, wherein the top portion is disposed on the top side of the substrate, and the two substantially parallel leg portions are disposed on the underside of the substrate, and wherein the additional electrical conductor is coupled to the substrate by the substrate being disposed through the aperture.

* * * * *